United States Patent
Kitamura

(10) Patent No.: US 12,136,546 B2
(45) Date of Patent: Nov. 5, 2024

(54) SEMICONDUCTOR DEVICE, MANUFACTURING METHOD THEREOF, AND SEMICONDUCTOR STORAGE DEVICE

(71) Applicant: Kioxia Corporation, Tokyo (JP)

(72) Inventor: Masayuki Kitamura, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/072,441

(22) Filed: Nov. 30, 2022

(65) Prior Publication Data

US 2023/0093431 A1    Mar. 23, 2023

Related U.S. Application Data

(62) Division of application No. 16/817,814, filed on Mar. 13, 2020, now abandoned.

(30) Foreign Application Priority Data

Sep. 18, 2019 (JP) .................. 2019-169528

(51) Int. Cl.
   *H01L 21/02* (2006.01)
   *H01L 29/24* (2006.01)
   *H01L 29/49* (2006.01)

(52) U.S. Cl.
   CPC .... *H01L 21/02565* (2013.01); *H01L 29/4966* (2013.01); *H01L 29/24* (2013.01)

(58) Field of Classification Search
   CPC .................. H01L 29/4966; H01L 21/3205
   See application file for complete search history.

(56) References Cited

U.S. PATENT DOCUMENTS

| | | | |
|---|---|---|---|
| 6,087,261 A | 7/2000 | Nishikawa et al. | |
| 8,436,417 B2* | 5/2013 | Shimizu | H01L 29/42348 257/314 |
| 9,620,610 B1 | 4/2017 | Jangjian | |
| 2006/0172474 A1 | 8/2006 | Wajda | |
| 2010/0127335 A1 | 5/2010 | Niimi | |
| 2012/0063947 A1* | 3/2012 | Billieres | C23C 4/137 427/446 |

(Continued)

FOREIGN PATENT DOCUMENTS

| | | |
|---|---|---|
| CN | 101128922 A | 2/2008 |
| JP | 61-203652 A | 9/1986 |

(Continued)

OTHER PUBLICATIONS

Wikipedia, Silicon dioxide—Wikipedia (Year: 2024).*

(Continued)

*Primary Examiner* — Vincent Wall
(74) *Attorney, Agent, or Firm* — Oblon, McClelland, Maier & Neustadt, L.L.P.

(57) ABSTRACT

A semiconductor device according to an embodiment includes an oxide film containing first element and a conductive film provided to be in contact with the oxide film, containing metal element and oxygen element, and having conductivity. A range of a volume density of the oxygen element in the conductive film is different between cases where the metal element are tungsten (W), molybdenum (Mo), titanium (Ti), chromium (Cr), vanadium (V), iron (Fe), copper (Cu), tantalum (Ta), or niobium (Nb).

5 Claims, 4 Drawing Sheets

(56) References Cited

U.S. PATENT DOCUMENTS

| | | | | |
|---|---|---|---|---|
| 2013/0009122 A1* | 1/2013 | Park | ............... | H10B 63/20 |
| | | | | 257/E47.001 |
| 2013/0285158 A1* | 10/2013 | Kitano | ............... | H01L 21/28088 |
| | | | | 257/407 |
| 2015/0340374 A1* | 11/2015 | Jung | ............... | H10B 43/27 |
| | | | | 438/258 |
| 2018/0166274 A1* | 6/2018 | Lin | ............... | H01L 29/78 |
| 2019/0172839 A1* | 6/2019 | Tokuda | ............... | H01L 29/7926 |

FOREIGN PATENT DOCUMENTS

| | | |
|---|---|---|
| JP | 04-001497 B2 | 1/1992 |
| JP | 04-343425 A | 11/1992 |
| JP | 5-319965 A | 12/1993 |
| JP | 10-050702 A | 2/1998 |
| JP | 11-168073 A | 6/1999 |
| TW | 201730942 A | 9/2017 |

OTHER PUBLICATIONS

Oh et al., "Improvement of electrical and optical properties of molybdenum oxide thin films by ultralow pressure sputtering method", J. Vac. Sci. Technol. A 30, 021501 (2012) (Year: 2012).*

* cited by examiner

SEMICONDUCTOR DEVICE, MANUFACTURING METHOD THEREOF, AND SEMICONDUCTOR STORAGE DEVICE

CROSS-REFERENCE TO RELATED APPLICATIONS

This application is a divisional of and claims benefit under 35 U.S.C. § 120 to U.S. application Ser. No. 16/817,814, filed Mar. 13, 2020, which is based upon and claims the benefit of priority under 35 U.S.C. § 119 to Japanese Patent Application No. 2019-169528, filed Sep. 18, 2019; the entire contents of each of which are incorporated by reference in their entirety.

FIELD

Embodiments of the present invention relate to a semiconductor device, a manufacturing method thereof, and a semiconductor storage device.

BACKGROUND

When a metal film is formed directly on an oxide film, there is a possibility that the metal film peels off because adhesion between the metal film and the oxide film is weak. Therefore, there is known a technique of forming a metal nitride film between the oxide film and the metal film. However, the resistivity of metal nitride is higher than that of metal, and therefore a conductive film including a metal nitride film and a metal film as a whole has a high resistance.

DETAILED DESCRIPTION

Embodiments will now be explained with reference to the accompanying drawings. The present invention is not limited to the embodiments.

A semiconductor device according to an embodiment comprises: an oxide film containing first element; and a conductive film provided to be in contact with the oxide film, containing metal element and oxygen atoms, and having conductivity. A volume density of the oxygen element in the conductive film is less than $2.38 \times 10^{22}$ atoms/cm$^3$ when the metal element is tungsten (W), less than $4.27 \times 10^{22}$ atoms/cm$^3$ when the metal element is molybdenum (Mo), less than $2.28 \times 10^{22}$ atoms/cm$^3$ when the metal element is titanium (Ti), less than $5.00 \times 10^{22}$ atoms/cm$^3$ when the metal element is chromium (Cr), less than $4.23 \times 10^{22}$ atoms/cm$^3$ when the metal element is vanadium (V), less than $4.84 \times 10^{22}$ atoms/cm$^3$ when the metal element is iron (Fe), less than $2.82 \times 10^{22}$ atoms/cm$^3$ when the metal element is copper (Cu), less than $3.32 \times 10^{22}$ atoms/cm$^3$ when the metal element is tantalum (Ta), and less than $2.78 \times 10^{22}$ atoms/cm$^3$ when the metal element is niobium (Nb).

First Embodiment

Figure 1:
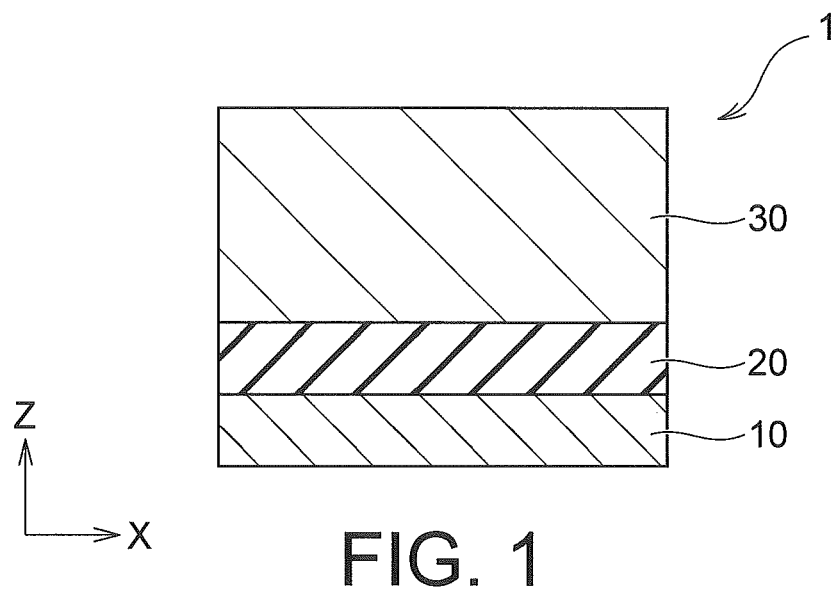
FIG. 1 is a cross-sectional view illustrating a structure of relevant parts of a semiconductor device according to a first embodiment.

FIG. 1 is a cross-sectional view illustrating a structure of relevant parts of a semiconductor device according to a first embodiment. The semiconductor device 1 according to the present embodiment includes a substrate 10, an oxide film 20, and a conductive film 30.

The substrate 10 is a silicon substrate, for example. The oxide film 20 is formed on the substrate 10. The oxide film 20 contains silicon oxide ($SiO_2$) or aluminum oxide ($Al_2O_3$), for example. The conductive film 30 is formed on the oxide film 20.

The conductive film 30 contains metal element and oxygen element. The metal element is, for example, tungsten (W), titanium (Ti), molybdenum (Mo), chromium (Cr), vanadium (V), iron (Fe), copper (Cu), tantalum (Ta), or niobium (Nb). The conductive film 30 has conductivity and has an electrical resistivity (a resistivity) of $1.0 \times 10^6$ μΩ/cm or less, for example.

A manufacturing method of the semiconductor device 1 according to the present embodiment is described below. Manufacturing steps of the conductive film 30 are described here.

Figure 2:
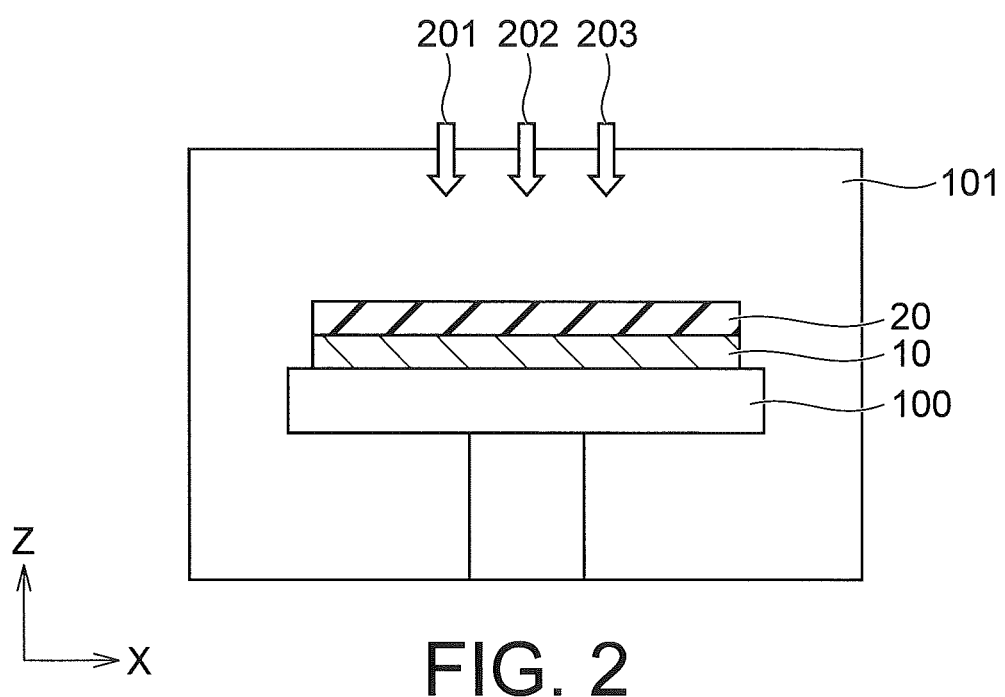
FIG. 2 is an explanatory diagram of a manufacturing method of the semiconductor device according to the first embodiment.

First, as illustrated in FIG. 2, the substrate 10 is accommodated in a chamber 101 while being fixed on a stage 100. At this time, the oxide film 20 has already been formed on the substrate 10. The oxide film 20 is a silicon oxide film in the present embodiment.

Subsequently, the conductive film 30 is formed on the oxide film 20 by CVD (Chemical Vapor Deposition). Specifically, a material gas 201 containing metal element and oxygen element and a reducing gas 202 that reduces the metal element contained in the material gas 201 are alternately introduced into the chamber 101. At this time, a carrier gas 203 is introduced between the material gas 201 and the reducing gas 202. A gas remaining in the chamber 101 is discharged by the carrier gas 203.

In the present embodiment, the material gas 201 is a gas containing tungsten dichloride dioxide ($WO_2Cl_2$). The reducing gas 202 is hydrogen ($H_2$) gas. The carrier gas 203 is argon (Ar) gas.

Figure 3A:
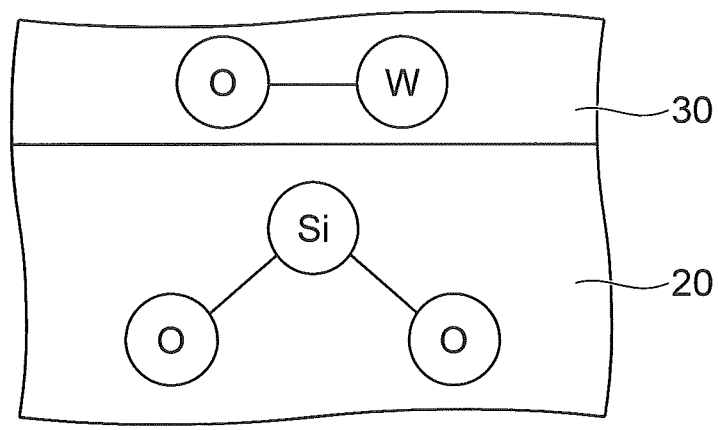
FIG. 3A is a diagram schematically illustrating a state of an interface between an oxide film and a conductive film.
Figure 3B:
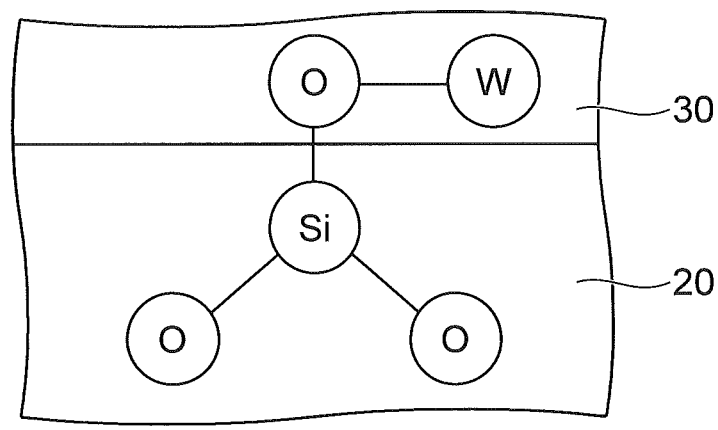
FIG. 3B is a diagram schematically illustrating a state of the interface between an oxide film and a conductive film.

FIGS. 3A and 3B are diagrams schematically illustrating states of atoms at an interface between the oxide film 20 and the conductive film 30. When the material gas 201, the reducing gas 202, and the carrier gas 203 described above are introduced into the chamber 101, the conductive film 30 containing tungsten element and oxygen element is formed on the oxide film 20 to be in contact therewith, as illustrated in FIG. 3A.

In general, oxygen atoms have a property of being easily bonded with silicon atoms. Therefore, as illustrated in FIG. 3B, oxygen atoms contained in the conductive film 30 are bonded with silicon atoms contained in the oxide film 20 at the interface between the conductive film 30 and the oxide film 20. In other words, metal atoms contained in the conductive film 30 are bonded with the silicon atoms in the oxide film 20 via the oxygen atoms. That is, an atom of the metal element is bounded with an atom of the oxygen element in the conductive film 30, and said atom of the oxygen element is bounded with an atom of the silicon element.

Therefore, according to the present embodiment, it is possible to increase adhesion between the conductive film 30 and the oxide film 20 without forming a high-resistance metal nitride film between the conductive film 30 and the oxide film 20.

Further, a binding energy between a metal atom (a tungsten atom) and an oxygen atom is smaller than a binding energy between a silicon atom and an oxygen atom. Therefore, in the present embodiment, the oxygen atoms contained in the conductive film 30 are to be bonded with the silicon atoms contained in the oxide film 20, rather than the metal atoms, at the interface between the conductive film 30 and the oxide film 20. Accordingly, it is possible to further increase the adhesion between the conductive film 30 and the oxide film 20. Meanwhile, in the present embodiment, when the oxygen concentration in the conductive film 30 is high, metal oxide is easily generated in the conductive film 30, which causes increase in the resistivity of the conductive film 30.

Figure 4:
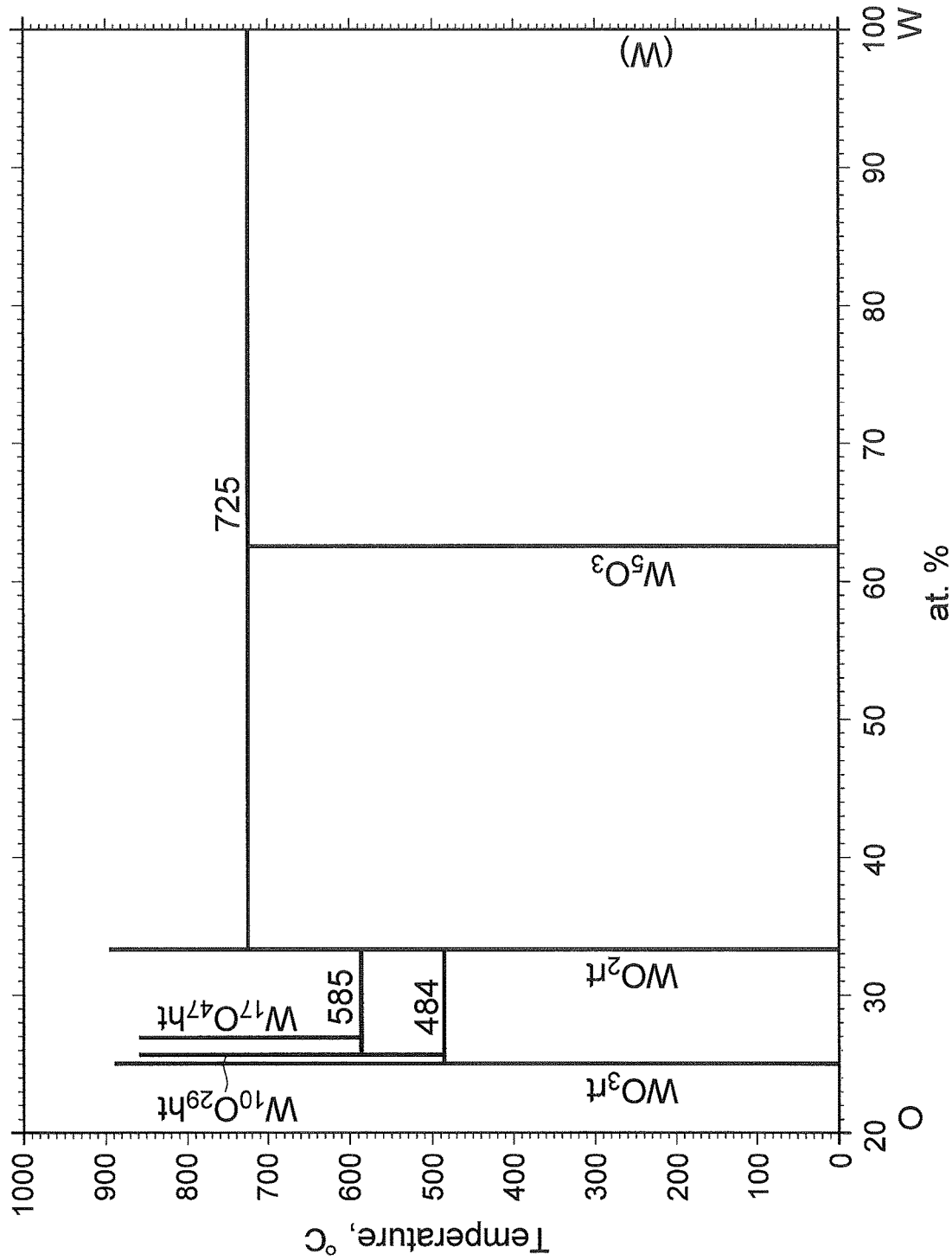
FIG. 4 is an example of a phase diagram of tungsten element and oxygen element.

FIG. 4 is an example of a phase diagram of tungsten element and oxygen element. According to the phase diagram illustrated in FIG. 4, tungsten oxide having the lowest oxygen atom ratio is pentatungsten trioxide ($W_5O_3$). An oxide concentration in this pentatungsten trioxide is about 37.5 atom %. When the oxide concentration in the conductive film 30 exceeds 37.5 atom %, tungsten oxide is generated, causing increase in the resistivity of the conductive film 30.

Because the number of atoms per unit volume of tungsten is about $6.3 \times 10^{22}$ atoms/cm$^3$, the volume density of oxygen element corresponding to 37.5% of the number of atoms described above is about $2.38 \times 10^{22}$ atoms/cm$^3$. Therefore, in order to ensure high adhesion between the oxide film 20 and the conductive film 30, suppress increase in the resistivity of the conductive film 30, and cause the conductive film 30 to have conductivity, it is desirable that the volume density of oxygen element in the conductive film 30 is less than $2.38 \times 10^{22}$ atoms/cm$^3$.

Further, also for metal other than tungsten, an upper limit of the volume density of oxygen element for causing the conductive film 30 to have the conductivity can be obtained by using a phase diagram or the like, as represented in the following Table 1.

TABLE 1

| Metal element | Oxide having lowest oxygen ratio | Upper limit of volume density of oxygen element (atoms/cm$^3$) |
| --- | --- | --- |
| Ti | $Ti_3O_2$ | $2.28 \times 10^{22}$ |
| Mo | $MoO_2$ | $4.27 \times 10^{22}$ |
| Cr | $Cr_2O_3$ | $5.00 \times 10^{22}$ |
| V | $V_2O_3$ | $4.23 \times 10^{22}$ |
| Fe | $Fe_3O_4$ | $4.84 \times 10^{22}$ |
| Cu | $Cu_2O$ | $2.82 \times 10^{22}$ |
| Ta | $Ta_2O_3$ | $3.32 \times 10^{22}$ |
| Nb | NbO | $2.78 \times 10^{22}$ |

Meanwhile, it is desirable that the conductive film 30 has a volume density of a certain number or more from a viewpoint of adhesion. For example, the adhesion with an oxide film can be further increased when the volume density of oxygen element in the conductive film 30 is $1.0 \times 10^{16}$ atoms/cm$^3$ or more.

Further, when the conductive film 30 is formed, it is desirable to set the temperature of the substrate 10 (a film forming temperature) to be higher than a sublimation temperature of metal oxide in which metal element contained in the conductive film 30 and oxygen element are bonded together, in order to suppress generation of the metal oxide. For example, when the temperature of the substrate 10 is higher than 750° C., it is possible to sublimate tungsten oxide. As a result, generation of the tungsten oxide in the conductive film 30 can be suppressed. Further, in a case where the metal element contained in the conductive film 30 is molybdenum, molybdenum oxide is sublimated at 400° C. to 600° C. Therefore, generation of the molybdenum oxide can be suppressed by setting the temperature of the substrate 10 to be higher than 400° C.

The following Table 2 represents stable oxides of the metal element described above and sublimation temperatures of those oxides. In film formation of atoms of each metal element, it is desirable to set the temperature of the substrate 10 (the film forming temperature) to be higher than the sublimation temperature described in Table 2. Such setting enables the metal oxide to be sublimated.

TABLE 2

| Metal element | Example of most stable oxide | Sublimation temperature (° C.) |
| --- | --- | --- |
| Ti | $TiO_2$ | 935 |
| Mo | $MoO_2$ | 397.5 |
| Cr | $Cr_2O_3$ | 1217.5 |
| V | $V_2O_5$ | 345 |
| Fe | $Fe_3O_4$ | 798.5 |
| Cu | $Cu_2O$ | 617.5 |
| Ta | $Ta_2O_5$ | 734 |
| Nb | $Nb_2O_5$ | 760 |
| W | $WO_3$ | 736.5 |

Although the material gas 201 contains oxygen element in the present embodiment, a film forming method of the conductive film 30 is not limited thereto. It suffices that the conductive film 30 is formed by using a combination of the material gas 201, the reducing gas 202, and the carrier gas 203 at least one of which contains oxygen element.

For example, when a combination of the material gas 201 containing a tungsten compound ($W(CO)_6$, $WF_6$, $WCl_6$, $WCl_5$, $WO_2Cl_2$, $WOCl_4$, or $W(CO)_6$), the reducing gas 202 containing hydrogen gas ($H_2$), nitrogen dioxide gas ($NO_2$), nitrous oxide gas ($N_2O$), carbon monoxide gas (CO), oxygen gas ($O_2$), or ozone gas (03), and the carrier gas 203 containing argon gas (Ar), nitrogen gas ($N_2$), or carbon dioxide gas ($CO_2$), at least one of which contains oxygen, is used, tungsten element and oxygen element are contained in the conductive film 30. Therefore, the adhesion between the conductive film 30 and the oxide film 20 is increased. Although tungsten has been referred to as an example here, the present embodiment can be achieved by another metal element similarly. For example, a gas containing a molybdenum compound ($MoO_2Cl_2$, $MoOCl_4$, $Mo(CO)_6$), a titanium compound ($Ti[OCH(CH_3)_2]_4$), a tantalum compound ($Ta(OC_2H_5)_5$), or a niobium compound ($Nb(OC_2H_5)_5$) can be used as the material gas.

Second Embodiment

Figure 5:
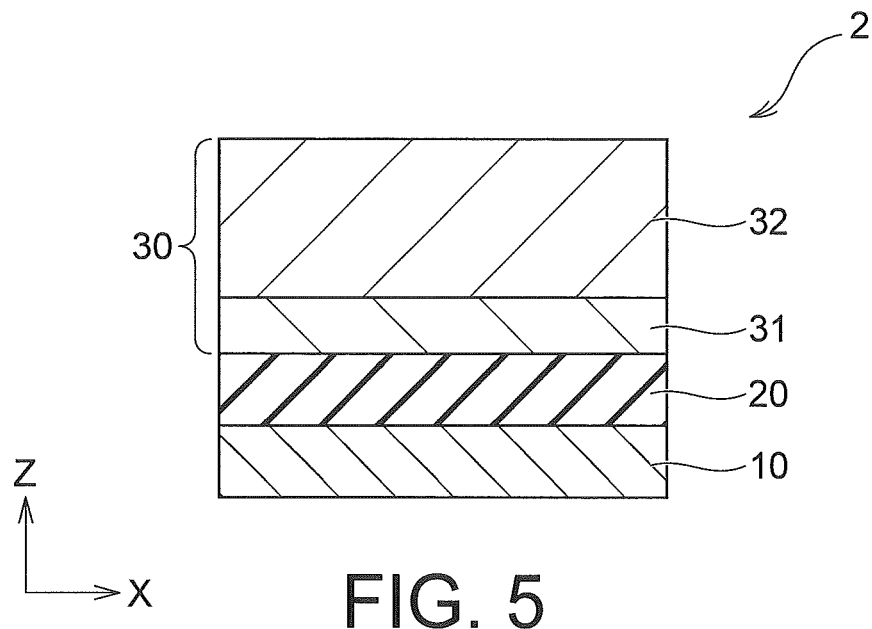
FIG. 5 is a cross-sectional view illustrating a structure of relevant parts of a semiconductor device according to a second embodiment.

FIG. 5 is a cross-sectional view illustrating a structure of relevant parts of a semiconductor device according to a second embodiment. Constituent elements identical to those of the semiconductor device 1 according to the first embodiment described above are denoted by like reference signs, and detailed explanations thereof are omitted.

As illustrated in FIG. 5, a semiconductor device 2 according to the present embodiment is different from that of the first embodiment in the structure of the conductive film 30. While the conductive film 30 according to the first embodiment has a single-layer structure, the conductive film 30 according to the present embodiment has a double-layer structure including a first layer 31 and a second layer 32.

The first layer 31 is in contact with the oxide film 20 and contains metal element and oxygen element. The first layer 31 is formed by identical manufacturing steps to those of the conductive film 30 according to the first embodiment described above. For example, when CVD is performed by using the material gas 201 containing tungsten dichloride dioxide, the reducing gas 202 containing hydrogen element, and the carrier gas 203 containing argon element, the first layer 31 containing tungsten element and oxygen element can be formed on the oxide film 20. At this time, if the first layer 31 is formed thick, its resistance becomes high. Therefore, it is desirable that the thickness of the first layer 31 is 10 nm or less.

The second layer 32 is formed on the first layer 31. The second layer 32 is formed by using the material gas 201 that is different from that for the first layer 31. For example, when CVD is performed by using the material gas 201 containing tungsten hexafluoride ($WF_6$), the reducing gas 202 containing hydrogen element, and the carrier gas 203 containing argon element, the second layer 32 containing tungsten element can be formed on the first layer 31. The second layer 32 has a lower resistance than the first layer 31, because the second layer 32 does not contain oxygen element. In order to reduce the resistance of the conductive film 30 as a whole, it is desirable that the second layer 32 is thicker than the first layer 31.

According to the present embodiment, it is possible to increase adhesion between the oxide film 20 and the conductive film 30 by forming the first layer 31 containing oxygen element on the oxide layer 20. Further, the resistance of the conductive film 30 can be reduced by forming the second layer 32 containing less impurities on the first layer 31. Accordingly, it is possible to achieve the conductive film 30 in which the adhesion and the low resistance are balanced.

Although metal element contained in the first layer 31 is the same type as metal element contained in the second layer 32 in the present embodiment, the metal element contained in the respective layers may be of different types from each other. For example, a structure may be employed in which molybdenum element is used for the first layer 31 and tungsten element is used for the second layer 32. Also in this case, the adhesion and the low resistance can be balanced. Further, although the second layer 32 has been described as a layer not containing oxygen element, the second layer 32 that is formed to have a lower oxygen concentration than the first layer 31 can also have identical effects to those in a case where the second layer 32 does not contain oxygen element.

Third Embodiment

Figure 6:
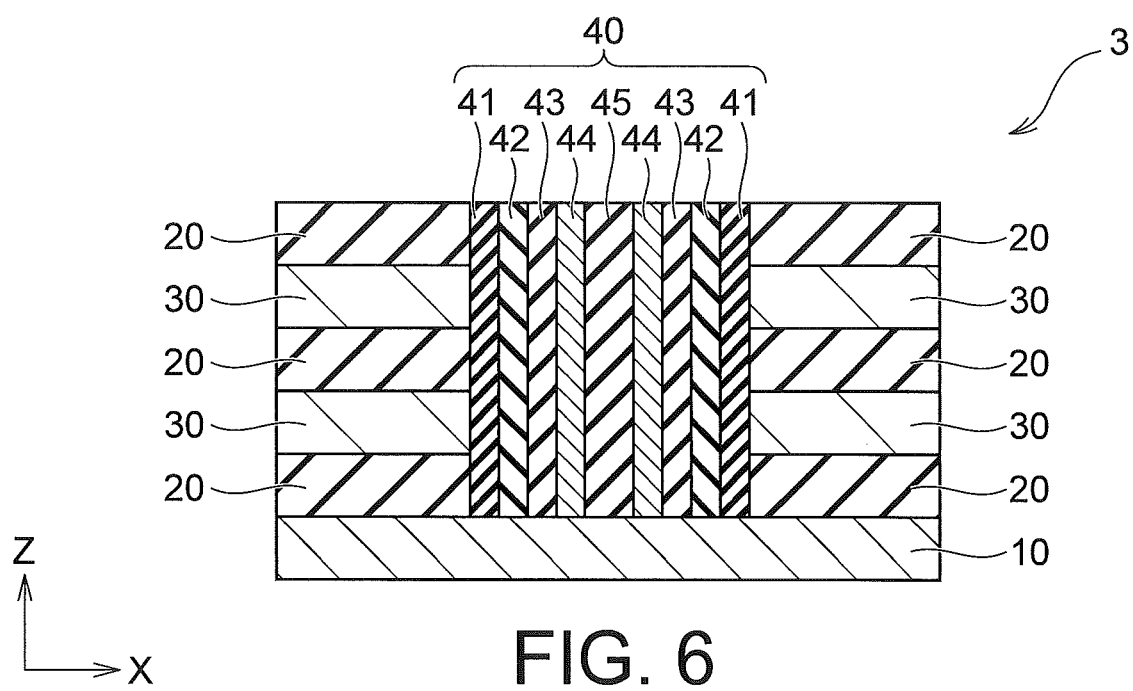
FIG. 6 is a cross-sectional view illustrating a structure of relevant parts of a semiconductor device according to a third embodiment.

FIG. 6 is a cross-sectional view illustrating a structure of relevant parts of a semiconductor device according to a third embodiment. A semiconductor device 3 illustrated in FIG. 6 is a three-dimensional semiconductor memory in which word lines are stacked. In the semiconductor device 3, the oxide films 20 and the conductive films 30 are alternately stacked on the substrate 10. Each conductive film 30 functions as a word line.

When each conductive film 30 of the third embodiment is formed, first, the oxide films 20 and sacrificial films are alternately stacked on the substrate 10. The sacrificial film is a silicon nitride (SiN) film, for example. The sacrificial film is removed by a chemical containing phosphoric acid, for example, after formation of a memory element film 40 described later. By removal of the sacrificial film, a cavity is formed between the oxide films 20. In this cavity, each conductive film 30 is formed in the manner described in the above first or second embodiment.

The memory element film 40 is formed in a hole that penetrates through a stack of the oxide films 20 and the above sacrificial films. A charge blocking film 41 is formed in an outer peripheral portion of this hole. A charge storage film 42 is formed inside the charge blocking film 41. A tunnel insulation film 43 is formed inside the charge storage film 42. A channel film 44 is formed inside the tunnel insulation film 43. A core film 45 is formed inside the channel film 44.

Each of the charge blocking film 41, the tunnel insulation film 43, and the core film 45 is a silicon oxide film, for example. The charge storage film 42 is a silicon nitride (SiN) film, for example. The channel film 44 is a polysilicon film, for example.

In the present embodiment, the conductive film 30 is formed in the manner described in the above first or second embodiment, and therefore contains oxygen element. Adhesion between the oxide film 20 and the conductive film 30 is improved because of this oxygen element. Therefore, metal nitride having a high resistance is not required. Accordingly, it is possible to reduce the resistance of the conductive film 30 while increasing the adhesion between the oxide film 20 and the conductive film 30.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of conductive films stacked apart from each other in a first direction;
a plurality of oxide films that are in contact with the conductive films in the first direction and are stacked via the conductive films;
a semiconductor layer penetrating through the conductive films and the oxide films in the first direction; and
a charge storage layer arranged between the semiconductor layer and the conductive films in a second direction crossing the first direction, wherein
the oxide films contain a first element different from oxygen,
the conductive films contain a tungsten element and oxygen,
a volume density of the oxygen in the conductive film is $1.0 \times 10^{16}$ atoms/cm$^3$ to less than $2.38 \times 10^{22}$ atoms/cm$^3$, and the conductive films consist of the tungsten element and the oxygen.

2. The semiconductor storage device of claim 1, wherein the first element is silicon.

3. The semiconductor storage device of claim 2, wherein an atom of the oxygen in the conductive films are bounded with an atom of the first element.

4. The semiconductor storage device of claim 3, wherein a binding energy between the tungsten element and the oxygen is smaller than a binding energy between oxygen and the first element.

5. The semiconductor storage device of claim 1, wherein the conductive films have an electrical resistivity of $1.0 \times 10^6$ µΩ/cm or less.

* * * * *